United States Patent
Zhang

(10) Patent No.: US 9,093,129 B2
(45) Date of Patent: *Jul. 28, 2015

(54) DISCRETE THREE-DIMENSIONAL MEMORY COMPRISING DICE WITH DIFFERENT BEOL STRUCTURES

(71) Applicant: ChengDu HaiCun IP Technology LLC, ChengDu (CN)

(72) Inventor: Guobiao Zhang, Corvallis, OR (US)

(73) Assignees: ChengDu HaiCun IP Technology LLC, ChengDu, SiChuan (CN); Guobiao Zhang, Corvallis, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/047,011

(22) Filed: Oct. 6, 2013

(65) Prior Publication Data

US 2014/0036566 A1     Feb. 6, 2014

Related U.S. Application Data

(63) Continuation-in-part of application No. 13/787,787, filed on Mar. 6, 2013, now Pat. No. 8,890,300, which is a continuation-in-part of application No. 13/591,257, filed on Aug. 22, 2012, now Pat. No. 8,921,991.

(60) Provisional application No. 61/529,929, filed on Sep. 1, 2011.

(51) Int. Cl.
*H01L 23/02*     (2006.01)
*G11C 5/06*     (2006.01)
(Continued)

(52) U.S. Cl.
CPC .. *G11C 5/06* (2013.01); *G11C 5/02* (2013.01); *G11C 5/145* (2013.01); *G11C 8/14* (2013.01); *G11C 13/0002* (2013.01); *G11C 2213/71* (2013.01); *H01L 25/0657* (2013.01); *H01L 25/105* (2013.01); *H01L 2224/32145* (2013.01);
(Continued)

(58) Field of Classification Search
CPC ........... H01L 2924/00014; H01L 2224/48091; H01L 2225/06562
USPC ................ 257/296, 303, 311, 314, 315, 686; 438/238, 241, 257, 258, 262, 264, 266
See application file for complete search history.

(56) References Cited

U.S. PATENT DOCUMENTS 4,404,655 A    9/1983    Naiff
4,424,579 A    1/1984    Roesner
(Continued)

OTHER PUBLICATIONS

Crowley et al. "612Mb PROM with 8 Layers of Antifuse/Diode Cells", 2003 International Solid-State Circuits Conference, Fig. 16.4.5.

(Continued)

*Primary Examiner* — Kyoung Lee
*Assistant Examiner* — Ratisha Mehta

(57) ABSTRACT

The present invention discloses a discrete three-dimensional memory (3D-M). It comprises at least a 3D-array die and at least a peripheral-circuit die. At least a peripheral-circuit component of the 3D-M is located on the peripheral-circuit die instead of the 3D-array die. The 3D-array die and the peripheral-circuit die have substantially different back-end-of-line (BEOL) structures, e.g. different number of BEOL layers, different number of interconnect layers, and/or different interconnect materials.

20 Claims, 9 Drawing Sheets

(51) Int. Cl.
*G11C 5/02* (2006.01)
*G11C 5/14* (2006.01)
*G11C 8/14* (2006.01)
*H01L 25/065* (2006.01)
*H01L 25/10* (2006.01)
*G11C 13/00* (2006.01)

(52) U.S. Cl.
CPC ............... *H01L 2224/32225* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06562* (2013.01); *H01L 2225/1023* (2013.01); *H01L 2225/1064* (2013.01)

(56) References Cited

U.S. PATENT DOCUMENTS

| | | |
|---|---|---|
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,385,074 B1 | 5/2002 | Johnson et al. |
| 6,486,728 B2 | 11/2002 | Kleveland |
| 6,591,394 B2 | 7/2003 | Lee et al. |
| 7,219,271 B2 | 5/2007 | Kleveland et al. |
| 7,383,476 B2 | 6/2008 | Crowley et al. |
| 7,952,904 B2 | 5/2011 | Zhang |
| 8,000,134 B2 | 8/2011 | Cornwell et al. |
| 8,223,525 B2 | 7/2012 | Balakrishnan et al. |
| 2003/0067043 A1* | 4/2003 | Zhang .................. 257/390 |
| 2006/0099775 A1* | 5/2006 | Daubenspeck et al. ....... 438/465 |
| 2006/0192294 A1* | 8/2006 | Lee .................. 257/778 |
| 2008/0130342 A1* | 6/2008 | Zhang .................. 365/51 |
| 2008/0159722 A1* | 7/2008 | Zhang .................. 386/124 |
| 2009/0032949 A1* | 2/2009 | Goswami .................. 257/741 |
| 2009/0278591 A1* | 11/2009 | Pyeon et al. .................. 327/536 |
| 2010/0142289 A1* | 6/2010 | Oku .................. 365/189.09 |
| 2010/0208503 A1* | 8/2010 | Kuo .................. 365/51 |
| 2011/0246857 A1* | 10/2011 | Bae et al. .................. 714/763 |

OTHER PUBLICATIONS

Liu et al. "A 130.7mm2 2-Layer 32Gb ReRAM Memory Device in 24nm Technology", 2013 International Solid-State Circuits Conference, Fig. 12.1.7.

* cited by examiner

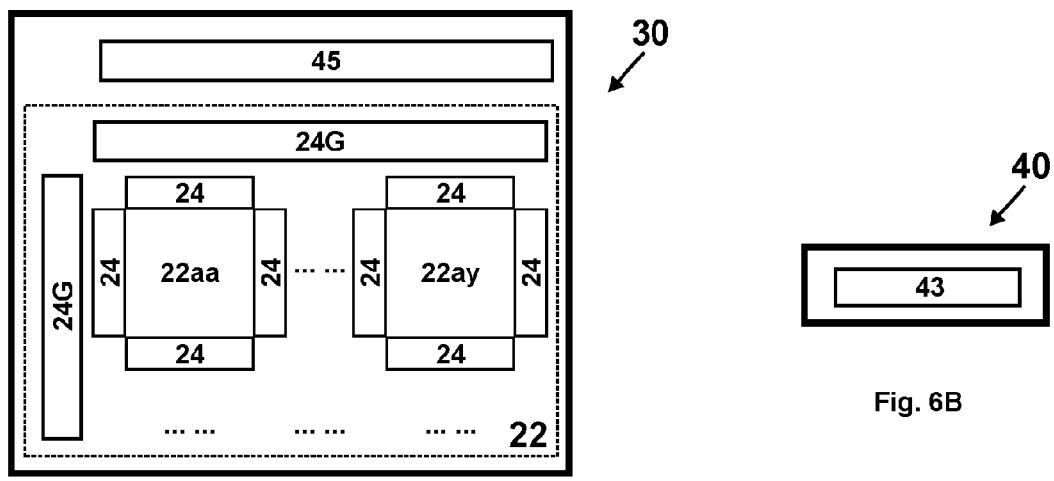
Fig. 6A
Fig. 6B
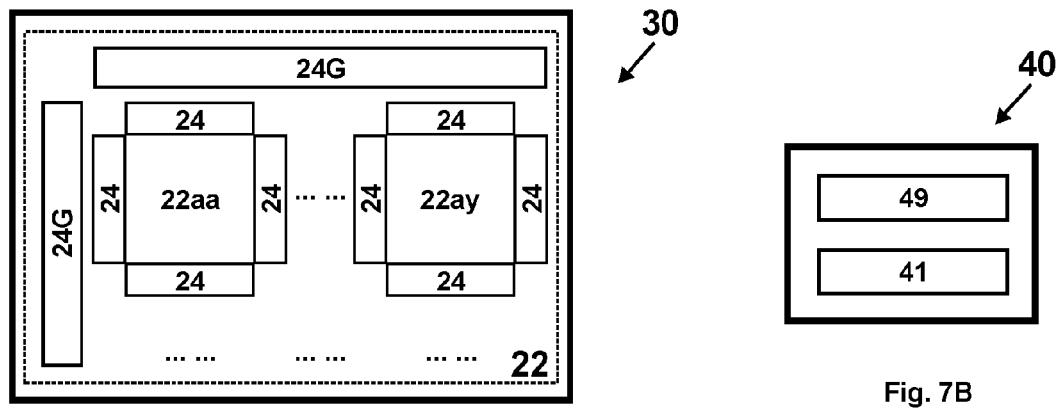
Fig. 7A
Fig. 7B

DISCRETE THREE-DIMENSIONAL MEMORY COMPRISING DICE WITH DIFFERENT BEOL STRUCTURES

CROSS-REFERENCE TO RELATED APPLICATIONS

This is a continuation-in-part of application "Discrete Three-Dimensional Memory Comprising Off-Die Read/Write-Voltage Generator", application Ser. No. 13/787,787, filed Mar. 6, 2013, which is a continuation-in-part of application "Discrete Three-Dimensional Memory", application Ser. No. 13/591,257, filed Aug. 22, 2012, which is a non-provisional of application "Three-Dimensional Memory with Separate Memory-Array and Peripheral-Circuit Substrates", Application Ser. No. 61/529,929, filed Sep. 1, 2011.

BACKGROUND

1. Technical Field of the Invention

The present invention relates to the field of integrated circuit, and more particularly to three-dimensional memory (3D-M).

2. Prior Arts

Three-dimensional memory (3D-M) is a monolithic semiconductor memory comprising a plurality of vertically stacked memory levels. It includes three-dimensional read-only memory (3D-ROM) and three-dimensional random-access memory (3D-RAM). The 3D-ROM can be further categorized into three-dimensional mask-programmed read-only memory (3D-MPROM) and three-dimensional electrically-programmable read-only memory (3D-EPROM). 3D-M may further comprise at least one of a 3D-memristor, 3D-RRAM or 3D-ReRAM (resistive random-access memory), 3D-PCM (phase-change memory), 3D-PMC (programmable metallization-cell memory), and 3D-CBRAM (conductive-bridging random-access memory).

U.S. Pat. No. 5,835,396 issued to Zhang on Nov. 3, 1998 discloses a 3D-M, more particularly a 3D-ROM. As illustrated in FIG. 1A, a 3D-M die 20 comprises a substrate-circuit level 0K and a plurality of vertically stacked memory levels 16A, 16B. The substrate-circuit level 0K comprises transistors 0t and interconnects 0i. The transistors 0t are formed in a semiconductor substrate 0. The interconnects 0i are formed above the substrate 0 and below the lowest memory level 16A. Hereinafter, the metal layers 0M1, 0M2 in the interconnects 0i are referred to as interconnect layers; the materials used in the interconnects 0i are referred to as interconnect materials, which include interconnect conductive materials and interconnect insulating materials.

Each of the memory levels (e.g. 16A, 16B) comprises a plurality of upper address lines (e.g. 2a), lower address lines (e.g. 1a) and memory cells (e.g. 5aa). It is coupled to the substrate 0 through contact vias (e.g. 1av). The memory cells could comprise diodes, transistors or other devices. Among all types of memory cells, the diode-based memory cells are of particular interest between they have the smallest size of ~4F², where F is the minimum feature size. Since they are generally located at the cross points between the upper and lower address lines, the diode-based memory cells form a cross-point array. Hereinafter, diode is broadly interpreted as any two-terminal device whose resistance at the read voltage is substantially lower than when the applied voltage has a magnitude smaller than or polarity opposite to that of the read voltage. In one exemplary embodiment, diode is a semiconductor diode, e.g. p-i-n silicon diode. In another exemplary embodiment, diode is a metal-oxide diode, e.g. titanium-oxide diode, nickel-oxide diode.

In FIG. 1A, the memory levels 16A, 16B form at least a 3D-M array 16, while the substrate-circuit level 0K comprises the peripheral circuit for the 3D-M array 16. A first portion of the peripheral circuit is located underneath the 3D-M array 16 and it is referred to as under-array peripheral circuit. A second portion of the peripheral circuit is located outside the 3D-M array 16 and it is referred to as outside-array peripheral circuits 18. It can be observed that the outside-array peripheral circuit 18 comprises significantly fewer back-end-of-line (BEOL) layers than the 3D-M array 16 and the space 17 above the outside-array peripheral circuits 18 is completely wasted. Hereinafter, a BEOL layer refers to the layer(s) defined by a single photolithography step during BEOL processing. In this example, the 3D-M array 16 comprises fourteen BEOL layers, including two for each interconnect layer (e.g. 0M1, 0M2) and five for each memory level (e.g. 16A, 16B). On the other hand, the outside-array peripheral circuit 18 comprises only four BEOL layers, including two for each interconnect layer (e.g. 0M1, 0M2).

U.S. Pat. No. 7,383,476 issued to Crowley et al. on Jun. 3, 2008 discloses an integrated 3D-M die, whose 3D-arrays and peripheral circuit are integrated on a same die. As is illustrated in FIG. 1B, an integrated 3D-M die 20 comprises a 3D-array region 22 and a peripheral-circuit region 28. The 3D-array region 22 comprises a plurality of 3D-M arrays (e.g. 22aa, 22ay) and their decoders (e.g. 24, 24G). These decoders include local decoders 24 and global decoders 24G. The local decoder 24 decodes address for a single 3D-M array, while the global decoder 24G decodes address to each 3D-M array.

The peripheral-circuit region 28 comprises all necessary peripheral-circuit components for a standalone integrated 3D-M die 20 to perform basic memory functions, i.e. it can directly use the voltage supply 23 provided by a user (e.g. a host device), directly read data 27 from the user and directly write data 27 to the user. It includes a read/write-voltage generator ($V_R/V_W$-generator) 21 and an address/data translator (A/D-translator) 29. The $V_R/V_W$-generator 21 provides read voltage $V_R$ and/or write (programming) voltage $V_W$ to the 3D-M array(s). The A/D-translator 29 converts address and/or data from a logical space to a physical space and vice versa. Hereinafter, the logical space is the space viewed from the perspective of a user of the 3D-M, while the physical space is the space viewed from the perspective of the 3D-M.

The $V_R/V_W$-generator 21 includes a band-gap reference generator (precision reference generator) 21B, a $V_R$ generator 21R and a charge-pump circuit 21W. Among them, the $V_R$ generator 21R generates the read voltage $V_R$, while the charge-pump circuit 21W generates the write voltage $V_W$ (referring to U.S. Pat. No. 6,486,728, "Multi-Stage Charge-pump circuit", issued to Kleveland on Nov. 26, 2002). The integrated 3D-M die 20 generates both read voltage and write voltage internally.

The A/D-translator 29 includes address translator and data translator. The address translator converts a logical address to a physical address and vice versa, while the data translator converts a logical data to a physical data and vice versa. Hereinafter, the logical address is the address at which data appears to reside from the perspective of the user and the physical address is the memory address that is represented on the address bus of the memory. Similarly, the logical data is the data transmitted from or received by the user and the physical data is the data that are physically stored in the memory cells. Note that the logical address/data are represented on the input/output 27 of the 3D-M die 20, while the physical address/data are represented on the internal bus 25 directly coupled to the 3D-M array region 22.

The A/D-translator 29 of FIG. 1B includes an oscillator 29O, an error checking & correction (ECC) circuit 29E, a page register/fault memory/trim-bit circuit 29P and a smart write controller 29W. The oscillator 29O provides an internal clock signal. The ECC circuit 29E detects and corrects errors while performing ECC-decoding after data are read out from the 3D-M arrays. It also performs ECC-encoding before data are written to the 3D-M arrays (referring to U.S. Pat. No. 6,591,394, "Three-Dimensional Memory Array and Method for Storing Data Bits and ECC Bits Therein" issued to Lee et al. on Jul. 8, 2003). The page register 29P serves as an intermediate storage device between the user and the 3D-M array(s), while the fault memory/trim-bit circuit 29P performs address mapping (referring to U.S. Pat. No. 8,223,525, "Page Register Outside Array and Sense Amplifier Interface", issued to Balakrishnan et al. on Jul. 17, 2012). The smart write controller 29W collects detected errors during programming and activates the self-repair mechanism which will reprogram the data in a redundant row (referring to U.S. Pat. No. 7,219,271, "Memory Device and Method for Redundancy/Self-Repair", issued to Kleveland et al. on May 15, 2007). The integrated 3D-M die 20 performs both address translation and data translation internally.

The $V_R/V_W$-generator 21 and A/D-translator 29 are outside-array peripheral-circuit components 18. Because they occupy a large area on the 3D-M die 20, the integrated 3D-M die 20 has a low array efficiency. The array efficiency is defined as the ratio between the total memory area (i.e. the chip area used for memory) and the total chip area. In 3D-M, the total memory area ($A_M$) is the chip area directly underneath user-addressable bits (not counting bits a user cannot access) and can be expressed as $A_M = A_C * C_L = (4F^2) * C_{3D-M}/N$, where $C_L$ is the storage capacity per memory level, $A_C$ is the area of a single memory cell, $C_{3D-M}$ is the total storage capacity of the 3D-M, F is the address-line pitch, and N is the total number of memory levels in the 3D-M. In the following paragraphs, two 3D-M dice are examined for their array efficiencies.

As a first example, a 3-D one-time-programmable memory (3D-OTP) is disclosed in Crowley et al. "612 Mb PROM with 8 Layers of Antifuse/Diode Cells" (referring to 2003 International Solid-State Circuits Conference, FIG. 16.4.5). This 3D-OTP die has a storage capacity of 612 Mb and comprises eight memory levels manufactured at 0.25 um node. The total memory area is $4*(0.25\ um)^2*612\ Mb/8=16\ mm^2$. With a total chip area of 48.3 $mm^2$, the array efficiency of the 3D-OTP die is ~33%.

As a second example, a 3-D resistive random-access memory (3D-ReRAM) is disclosed in Liu et al. "A 130.7 $mm^2$ 2-Layer 32 Gb ReRAM Memory Device in 24 nm Technology" (referring to 2013 International Solid-State Circuits Conference, FIG. 12.1.7). This 3D-ReRAM die has a storage capacity of 32 Gb and comprises two memory levels manufactured at 24 nm node. The total memory area is $4*(24\ nm)^2*32\ Gb/2=36.8\ mm^2$. With a total chip area of 130.7 $mm^2$, the array efficiency of the 3D-ReRAM die is ~28%.

It is a prevailing belief in the field of integrated circuit that integration lowers cost and more integration is better than less integration. However, this belief is no longer true for the 3D-M. For the integrated 3D-M 20, integrating the peripheral-circuit components 28 with the 3D-M arrays 22 actually increases cost. This is based on three major reasons. First of all, because the peripheral-circuit components 28 comprise significantly fewer BEOL layers than the 3D-M arrays 22, integration increases the overall 3D-M cost when the peripheral-circuit components 28 are forced to use the same expensive BEOL processes as the 3D-M arrays 22. Secondly, because they are forced to use the same number of interconnect layers (as few as two) as the 3D-M arrays 22, the peripheral-circuit components 28 are difficult to design, have a poor performance and occupy a large chip area. Thirdly, because the 3D-M cells (e.g. 5aa) require high-temperature processing, the interconnects 0i underneath the 3D-M cells need to use high-temperature interconnect materials. Being integrated, the peripheral-circuit components 28 are forced to use the same high-temperature interconnect materials, e.g. tungsten (W) for the interconnect conductive materials, and/or silicon oxide ($SiO_2$) for the interconnect insulating materials. These materials degrade the performance of the peripheral circuit and in turn, degrade the overall 3D-M performance.

Objects and Advantages

It is a principle object of the present invention to provide a three-dimensional memory (3D-M) with a lower overall cost.

It is a further object of the present invention to provide a 3D-M with an improved performance.

In accordance with these and other objects of the present invention, a discrete 3D-M is disclosed.

SUMMARY OF THE INVENTION

The present invention discloses a discrete three-dimensional memory (3D-M). It comprises at least a 3D-array die and at least a peripheral-circuit die. The 3D-array die comprises a plurality of 3D-M arrays, each of which is formed in a 3-D space and includes multiple functional levels, i.e. a plurality of vertically stacked memory levels. On the other hand, the peripheral-circuit die is formed on a 2-D plane and includes only a single functional level, i.e. a substrate-circuit level. In a discrete 3D-M, at least a peripheral-circuit component of the 3D-M is located on the peripheral-circuit die instead of the 3D-array die. This peripheral-circuit component is an essential circuit for the 3D-M to perform basic memory functions, e.g. directly using the voltage supply provided by a user, directly reading data from the user and directly writing data to the user. It could be a read/write-voltage generator ($V_R/V_W$-generator), an address/data translator (A/D-translator), a portion of the $V_R/V_W$-generator, and/or a portion of the A/D-translator. Interestingly, although the absence of this peripheral-circuit component makes the 3D-array die per se not a functional memory, it brings at least one key benefit: the 3D-array die has a high array efficiency. Its array efficiency can easily surpass 40%. By moving all peripheral-circuit components to the peripheral-circuit die, the array efficiency of the 3D-array die could reach ~60%.

Because they are designed and manufactured separately, the 3D-array die and the peripheral-circuit die in a discrete 3D-M can have substantially different back-end-of-line (BEOL) structures. First of all, the peripheral-circuit die comprises significantly fewer BEOL layers than the 3D-array die. Accordingly, the peripheral-circuit die can be manufactured using much less complex BEOL processes and has a much lower wafer cost. Overall, the discrete 3D-M has a lower cost than the integrated 3D-M for a given storage capacity. Secondly, the peripheral-circuit die can comprise more interconnect layers than the 3D-array die. Accordingly, the peripheral-circuit components on the peripheral-circuit die are easier to design, have a better performance and occupy less chip area. Thirdly, although the 3D-array die has to use high-temperature interconnect materials, the peripheral-circuit die may use high-speed interconnect materials, e.g. high-speed interconnect conductive materials such as aluminum (Al) or copper (Cu), and/or high-speed interconnect insulating materials such as low-k dielectric. These materials can improve the performance of the peripheral circuit and in turn, improve the overall 3D-M performance.

BRIEF DESCRIPTION OF THE DRAWINGS

FIG. 3BB is a cross-sectional view of a second preferred peripheral-circuit die;

FIGS. 6A-6B disclose a first preferred partitioning scheme;

FIGS. 7A-7B disclose a second preferred partitioning scheme;

Figure 1A:
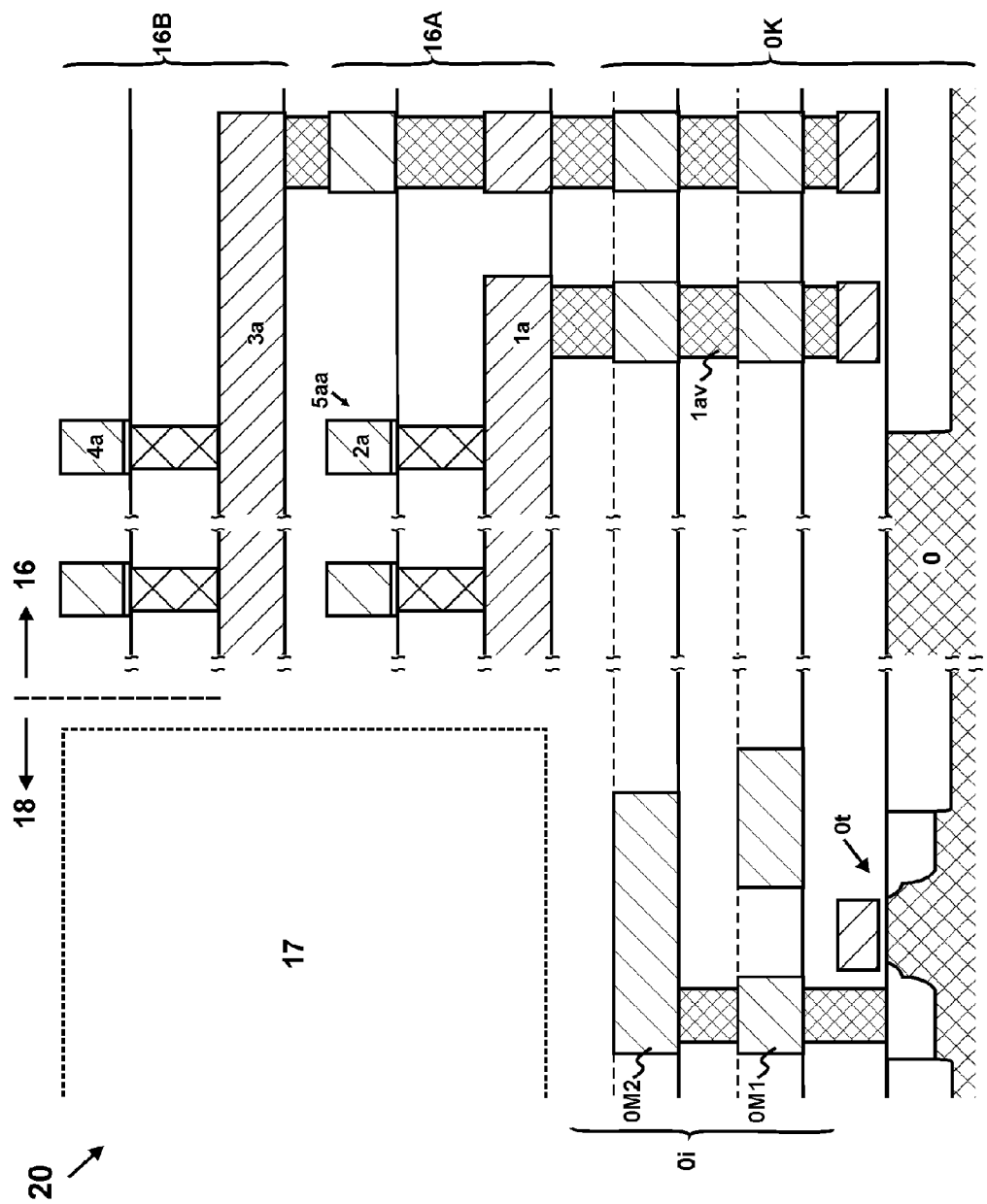
FIG. 1A is a cross-sectional view of a three-dimensional memory (3D-M)

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

In the present invention, the symbol "/" means a relationship of "and" or "or". For example, the read/write-voltage generator ($V_R/V_W$-generator) could generate either only the read voltage, or only the write voltage, or both the read voltage and the write voltage. In another example, the address/data translator (A/D-translator) could translate either only address, or only data, or both address and data.

Figure 2A:
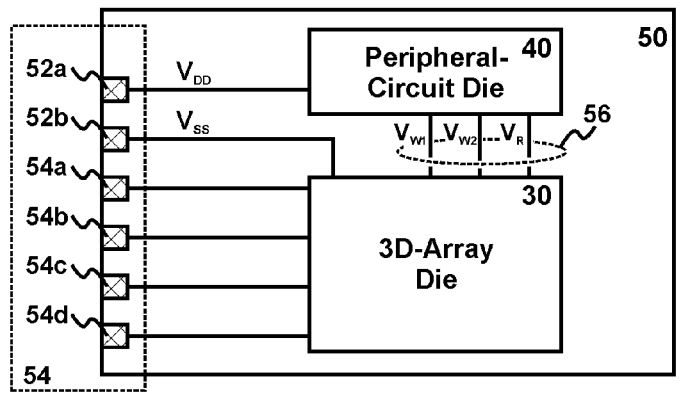
FIG. 2A illustrates a first preferred discrete 3D-M with one peripheral-circuit die.
Figure 2B:
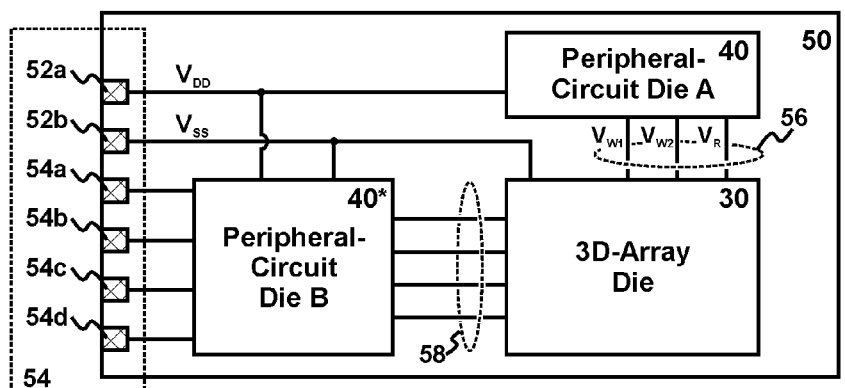
FIG. 2B illustrates a second preferred discrete 3D-M with two peripheral-circuit dice.
Figure 2C:
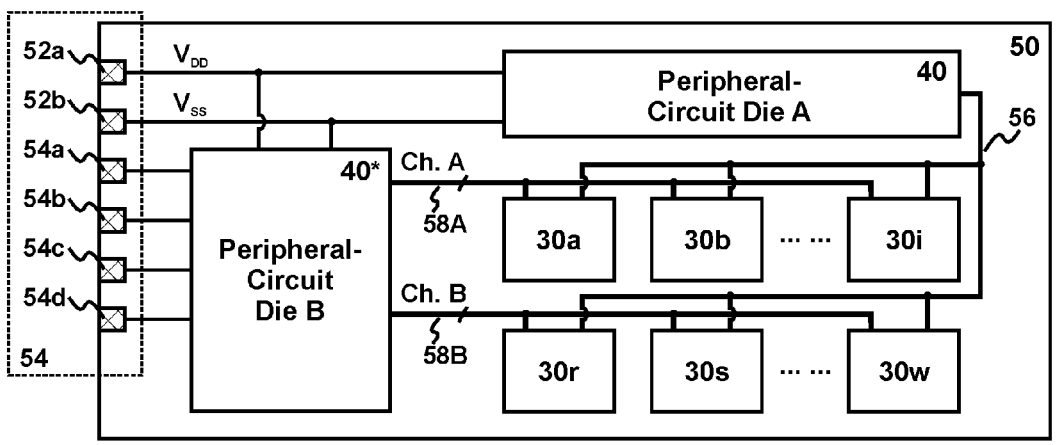
FIG. 2C illustrates a third preferred discrete 3D-M supporting multiple 3D-array dice.

Referring now to FIGS. 2A-2C, three preferred discrete three-dimensional memory (3D-M) 50 are disclosed. The discrete 3D-M 50 includes a physical interface 54 according to a standard for connecting to a variety of hosts. Physical interface 54 includes individual contacts 52a, 52b, 54a-54d that connect with corresponding contacts in a host receptacle. The power-supply contact 52a is provided to connect to a power-supply contact in the host receptacle. The voltage supplied by the host to power-supply contact 52a is referred to as voltage supply $V_{DD}$. The ground contact 52b provides a ground connection at a voltage $V_{SS}$. The contacts 54a-54d provide signal connections between the host and the discrete 3D-M 50. The signals represented on the contacts 54a-54d include address and data, among others. Because they are directly to/from the host, the address and data represented on the contacts 54a-54d are logical address and logical data.

The discrete 3D-M 50 comprises at least a 3D-array die 30 and at least a peripheral-circuit die 40. In these figures, at least a peripheral-circuit component of the 3D-M is located on the peripheral-circuit die 40 instead of the 3D-array die 30. This peripheral-circuit component is an essential circuit for the 3D-M to perform basic memory functions, e.g. directly using the voltage supply provided by the host, directly reading data from the host and directly writing data to the host. As will be further explained in FIG. 4, a peripheral-circuit component could be any circuit between the global decoder 24G of the 3D-array region 22 and the physical interface 54. It could be a read/write-voltage generator ($V_R/V_W$-generator), an address/data translator (A/D-translator), a portion of the $V_R/V_W$-generator, and/or a portion of the A/D-translator. Without this peripheral-circuit component, the 3D-array die 30 per se is not a functional memory.

The preferred discrete 3D-M 50 in FIG. 2A is in the form of a memory card. Its peripheral-circuit die 40 comprises a $V_R/V_W$-generator, which receives a voltage supply $V_{DD}$ from the power-supply contact 52a and provides the 3D-array die 30 with at least a read/write voltage through a power bus 56. The read/write voltage includes at least a read voltage and/or a write voltage other than the voltage supply $V_{DD}$. In other words, it could be either at least a read voltage $V_R$, or at least a write voltage $V_W$, or both read voltage $V_R$ and write voltage $V_W$, and the values of these read voltages and write voltages are different from the voltage supply $V_{DD}$. In this preferred embodiment, the read/write voltage includes one read voltage $V_R$ and two write voltages $V_{W1}$, $V_{W2}$. Alternatively, it could include more than one read voltage or more than two write voltages.

The preferred discrete 3D-M 50 in FIG. 2B is also in the form of a memory card. It comprises two separate peripheral-circuit dice A and B. The peripheral-circuit die A 40 comprises a $V_R/V_W$-generator and the peripheral-circuit die B 40* comprises an A/D-translator. The A/D-translator converts the logical address/data represented on the contacts 54a-54d to the physical address/data represented on an internal bus 58 and vice versa.

The preferred discrete 3D-M 50 in FIG. 2C can be used for a high-capacity 3D-M-based memory card or a 3D-M-based solid-state drive. It comprises a plurality of 3D-array dice 30a, 30b . . . 30w. These 3D-array dice form two channels: Channel A and Channel B. The internal bus 58A on Channel A provides physical address/data to the 3D-array dice 30a, 30b . . . 30i, while the internal bus 58B on Channel B provides physical address/data to the 3D-array dice 30r, 30s . . . 30w. The power bus 56 provides read/write-voltages to all 3D-array dice 30a, 30b . . . 30w. Although two channels are used in this example, it should be apparent to those skilled in the art that more than two channels may be used.

Figure 3A:
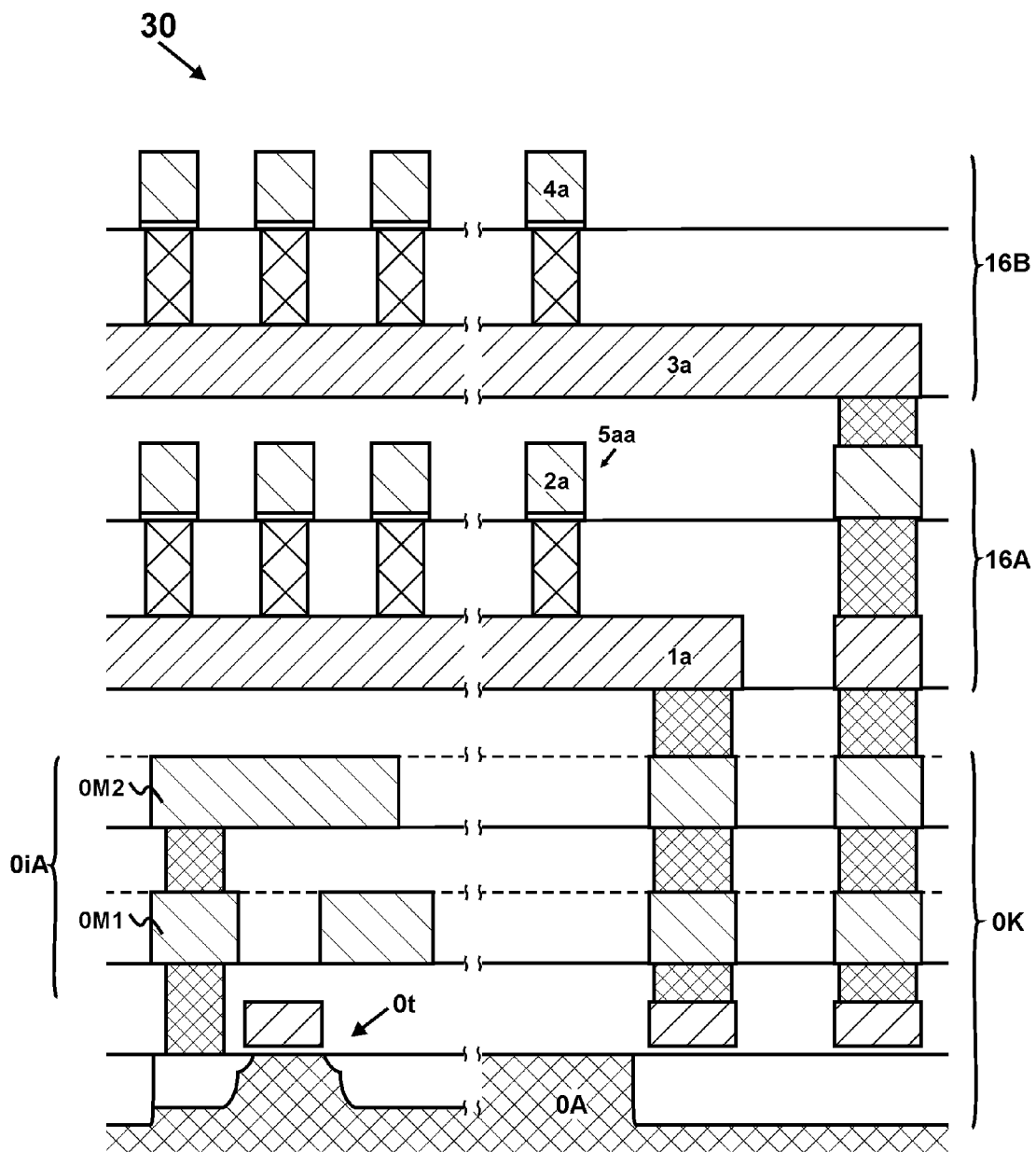
FIG. 3A is a cross-sectional view of a preferred 3D-array die.

Referring now to FIG. 3A, a cross-sectional view of a preferred 3D-array die 30 is disclosed. The preferred 3D-array die 30 is formed in a 3-D space and includes multiple functional levels, i.e. a substrate-circuit level 0K and a plurality of memory levels 16A, 16B. The substrate-circuit level 0K comprises transistors 0t and interconnects 0iA. The transistors 0t are formed in a 3D-array substrate 0A. The interconnects 0iA include two interconnect layers, i.e. metal layers 0M1, 0M2. To accommodate the high-temperature process for the memory cells (e.g. 5aa), the interconnects 0iA preferably comprise high-temperature interconnect materials, e.g. tungsten (W) for the interconnect conductive materials and silicon oxide ($SiO_2$) for the interconnect insulating materials. Similar to FIG. 1A, this preferred 3D-array die 30 comprises fourteen BEOL layers, including two for each interconnect layer (e.g. 0M1, 0M2) and five for each memory level (e.g. 16A, 16B).

In the present invention, the term "BEOL layer" should not be confused with the term "interconnect layer". Each BEOL layer includes the layer(s) defined by a single photolithography step during BEOL processing. It could be a via layer, a metal layer, an address-line layer or a diode layer. Because it is equal to the total number of the BEOL photolithography steps, the number of the BEOL layers in an integrated circuit indicates the complexity of its BEOL processes and is roughly proportional to its manufacturing cost. On the other hand, each interconnect layer corresponds to a layer of conductive line (not including any via layer) in the interconnects. In most cases, it corresponds to a metal layer. The interconnect layers in a 3D-array die 30 include only the metal layers (e.g. 0M1, 0M2) in the interconnects 0iA, but not the metal layers in any memory levels (e.g. 16A, 16B).

Figure 3B:
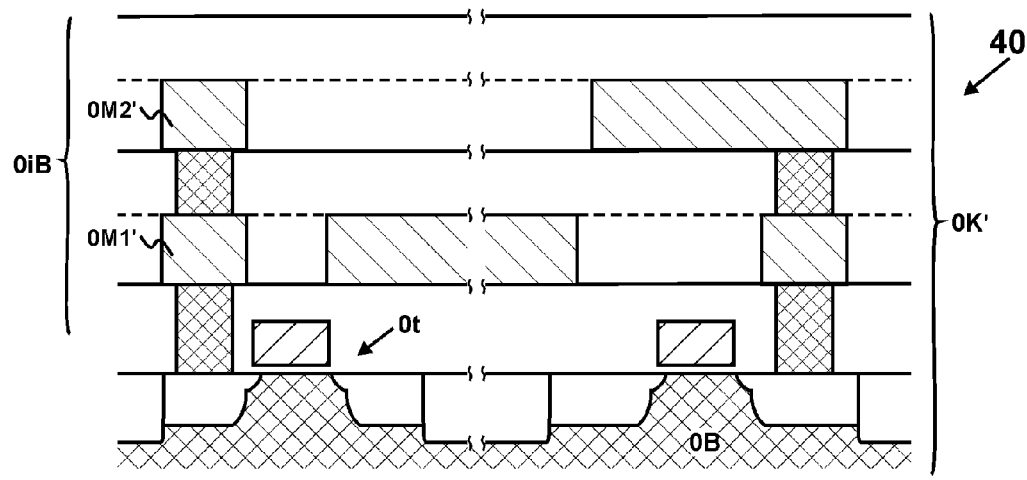
FIG. 3BA is a cross-sectional view of a first preferred peripheral-circuit die.
Figure 3B:
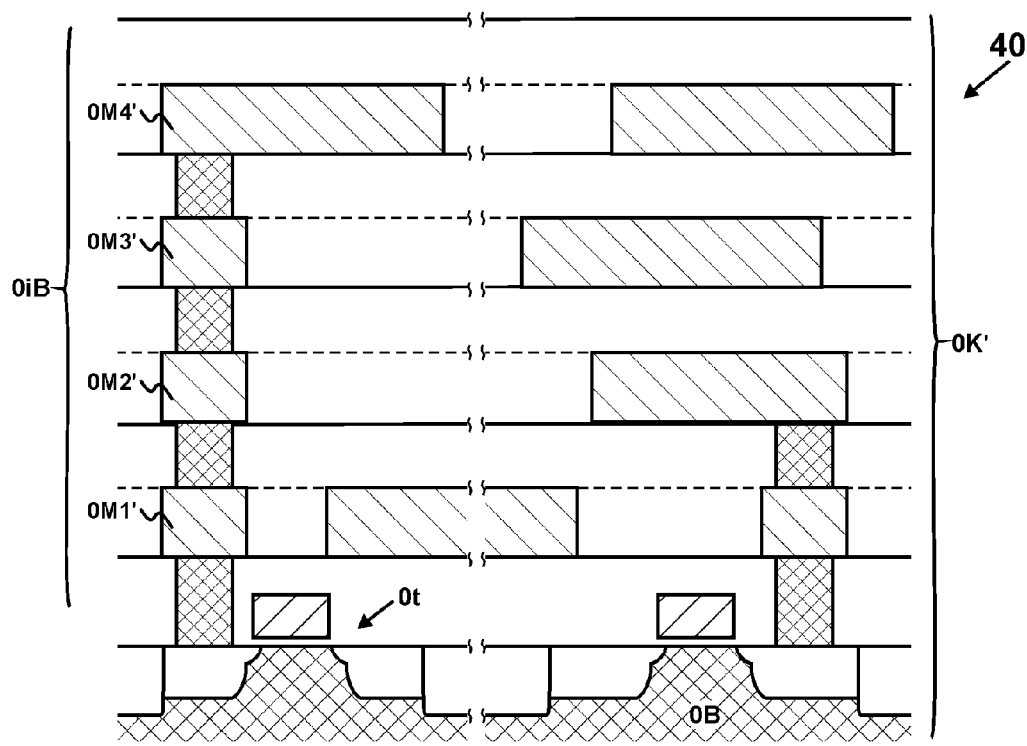

Referring now to FIGS. 3BA-3BB, cross-sectional views of two preferred peripheral-circuit dice 40 are disclosed. The peripheral-circuit die 40 is formed on a 2-D plane and includes a single functional level, i.e. the substrate-circuit level 0K'. The substrate-circuit level 0K' comprises transistors 0t and interconnects 0iB. The transistors are formed in a peripheral-circuit substrate 0B. In the preferred embodiment of FIG. 3BA, the interconnects 0iB comprise two interconnect layers, i.e. metal layers 0M1'-0M2'. In other words, the peripheral-circuit die 40 comprises only four BEOL layers, including two for each interconnect layer (e.g. 0M1, 0M2). Comprising much fewer BEOL layers (4 vs. 14) than the 3D-array die 30, the peripheral-circuit die 40 can be manufactured using less complex BEOL processes and has a much lower wafer cost. Overall, the discrete 3D-M 50 has a lower cost than the integrated 3D-M 20 for a given storage capacity.

Figure 1B:
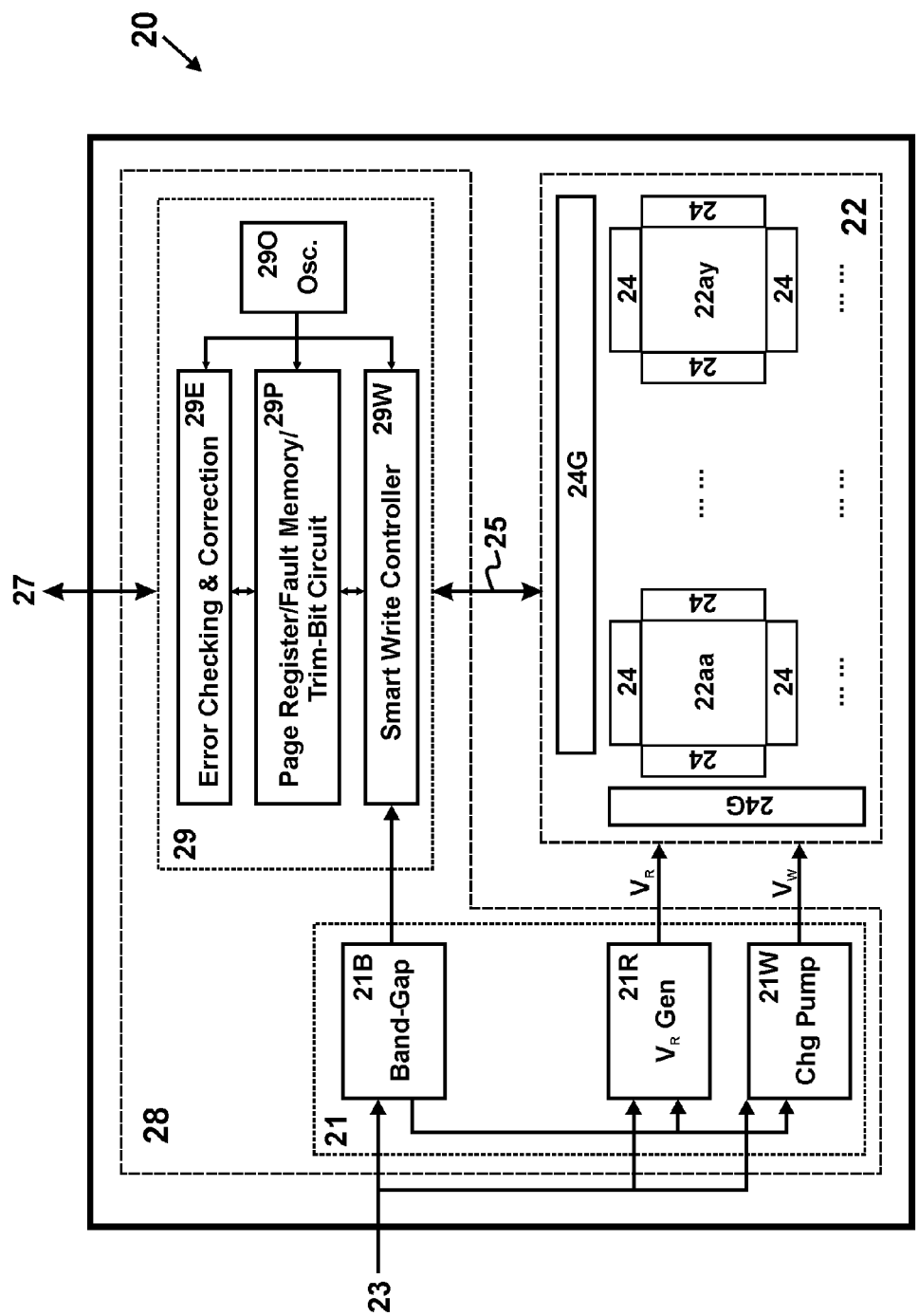
FIG. 1B is a block diagram of an integrated 3D-M die (prior art)

Because it is no longer integrated with the 3D-array die 30, the peripheral-circuit die 40 can comprise more interconnect layers than the peripheral-circuit region 28 in the integrated 3D-M 20 of FIG. 1B, or the 3D-array die 30 of FIG. 3A. As is illustrated in FIG. 3BB, the interconnects 0iB comprise four interconnect layers 0M1'-0M4'. With more interconnect layers, the peripheral-circuit components on the peripheral-circuit die 40 are easier to design, have a better performance and occupy less chip area than those on the integrated 3D-M die 20. This contributes further to the cost-saving effects of the discrete 3D-M 50. Note that, although it comprises more interconnect layers than the peripheral-circuit die 40 of FIG. 3BA, the peripheral-circuit die 40 of FIG. 3BB still comprises significantly fewer BEOL layers (8 vs. 14) than the 3D-array die 30 of FIG. 3A.

Although the 3D-array die 30 has to use high-temperature interconnect materials, the peripheral-circuit die 40 of FIGS. 3BA-3BB may use high-speed interconnect materials for the interconnects 0iB. This is because a separate peripheral-circuit die 40 of FIGS. 3BA-3BB does not have to go through any high-temperature BEOL processing steps of the 3D-array die 30. The peripheral-circuit die 40 may use high-speed interconnect conductive materials such as aluminum (Al) or copper (Cu). It may also use high-speed interconnect insulating materials such as low-k dielectric. These materials can improve the performance of the peripheral circuit 40 and in turn, improve the overall 3D-M performance.

For a conventional two-dimensional memory (2D-M, whose memory cells are arranged on a 2-D plane, e.g. flash memory), although it is possible to form at least a peripheral-circuit component on a peripheral-circuit die instead of a 2D-array die, doing so will increase the overall 2D-M cost. This is because the 2D-array die and the peripheral-circuit die have similar BEOL structures (i.e. similar number of BEOL layers, similar number of interconnect layers, and similar interconnect materials) and similar wafer costs. Adding the extra bonding cost, a discrete 2D-M is more expensive than an integrated 2D-M. This is in sharp contrast to the 3D-M. The 3D-array die 30 and peripheral-circuit die 40 of a discrete 3D-M 50 have substantially different BEOL structures (e.g. different number of BEOL layers, different number of interconnect layers, and/or different interconnect materials). As a result, a discrete 3D-M is less expensive than an integrated 3D-M.

Figure 4:
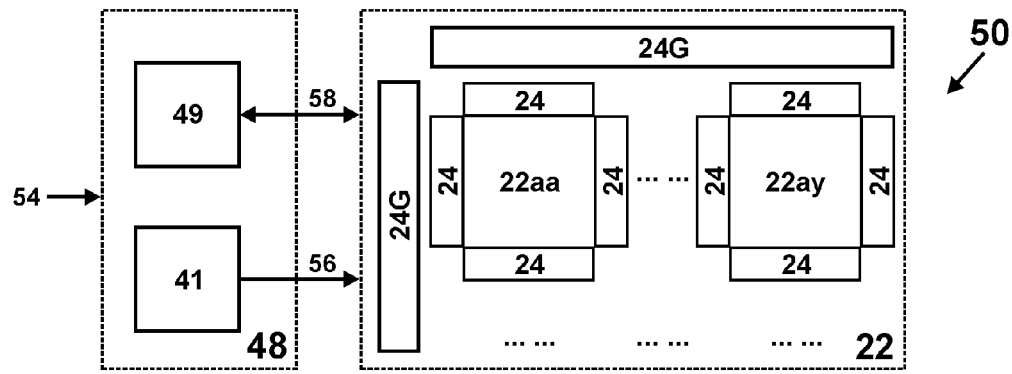
FIG. 4 is a block diagram of a preferred discrete 3D-M.

FIG. 4 is a block diagram of a preferred discrete 3D-M 50. Because it does not illustrate the physical implementation, this block diagram is similar to the integrated 3D-M 20 of FIG. 1B. The discrete 3D-M 50 comprises a 3D-array block 22 and a peripheral-circuit block 48. The 3D-array block 22 comprises a plurality of 3D-M arrays (e.g. 22aa, 22ay) and their decoders (e.g. 24, 24G). The peripheral-circuit block 48 comprises a $V_R/V_W$-generator 41 and an A/D-translator 49. The $V_R/V_W$-generator 41 converts the voltage supply 54 to the read/write voltages 56 of the 3D-M array(s). The A/D-translator 49 converts logical address/data 54 to physical address/data 58 and vice versa.

Figure 5A:
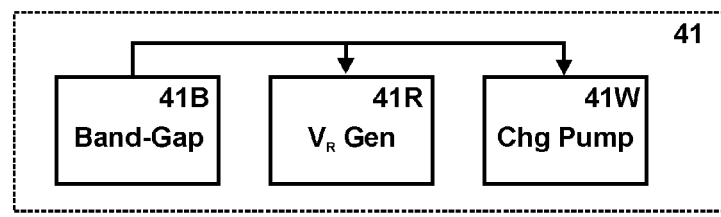
FIG. 5A is a block diagram of a preferred $V_R/V_W$-generator.

FIG. 5A is a block diagram of a preferred $V_R/V_W$-generator 41. It includes a band-gap reference generator (precision reference generator) 41B, a $V_R$ generator 41R and a charge-pump circuit 41W. Among them, the $V_R$ generator 41R generates the read voltage $V_R$, while the charge-pump circuit 41W generates the write voltage $V_W$ (referring to U.S. Pat. No. 6,486,728, "Multi-Stage Charge-pump circuit", issued to Kleveland on Nov. 26, 2002). It should be apparent to those skilled in the art that many other voltage converters can be used in the $V_R/V_W$-generator 41. Examples of suitable voltage converters include boost converter, low-dropout regulator (LDO) and buck converter.

Figure 5B:
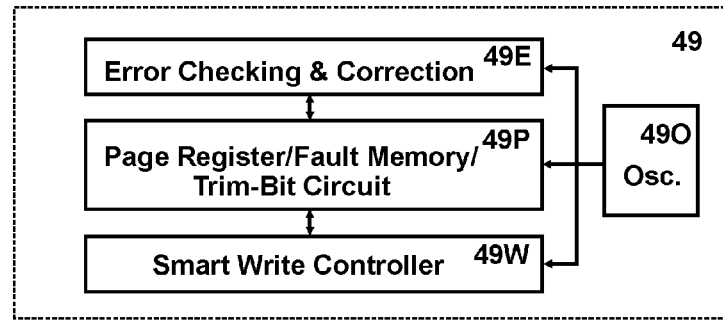
FIG. 5B is a block diagram of a preferred A/D-translator.

FIG. 5B is a block diagram of a preferred A/D-translator 49. It includes an oscillator 490, an error checking & correction (ECC) circuit 49E, a page register/fault memory/trim-bit circuit 49P and a smart write controller 49W. The oscillator 490 provides an internal clock signal. The ECC circuit 49E detects and corrects errors while performing ECC-decoding after data are read out from the 3D-M arrays. It also performs ECC-encoding before data are written to the 3D-M arrays (referring to U.S. Pat. No. 6,591,394, "Three-Dimensional Memory Array and Method for Storing Data Bits and ECC Bits Therein" issued to Lee et al. on Jul. 8, 2003). The page register 49P serves as an intermediate storage device between the user and the 3D-M array(s), while the fault memory/trim-bit circuit 49P performs address mapping (referring to U.S. Pat. No. 8,223,525, "Page Register Outside Array and Sense Amplifier Interface", issued to Balakrishnan et al. on Jul. 17, 2012). The smart write controller 49W collects detected errors during programming and activates the self-repair mechanism which will reprogram the data in a redundant row (referring to U.S. Pat. No. 7,219,271, "Memory Device and Method for Redundancy/Self-Repair", issued to Kleveland et al. on May 15, 2007).

Different from the integrated 3D-M 20 where all peripheral-circuit components are located on the 3D-M die 20, at least a peripheral-circuit component of the discrete 3D-M 50 is located on the peripheral-circuit die 40 instead of the 3D-array die 30. In other words, the peripheral-circuit components are partitioned between the 3D-array die 30 and the peripheral-circuit die 40. Several preferred partitioning schemes are disclosed in FIGS. 6A-9B.

FIGS. 6A-6B disclose a first preferred partitioning scheme. The discrete 3D-M 50 comprises a 3D-array die 30 and a peripheral-circuit die 40. In FIG. 6A, the 3D-array die 30 comprises a plurality of 3D-M arrays (e.g. 22aa, 22ay) and decoders. It also comprises a number of peripheral-circuit components 45. In FIG. 6B, the peripheral-circuit die 40 comprises at least a peripheral-circuit component 43. This peripheral-circuit component 43 could be a $V_R/V_W$-generator, an A/D-translator, a portion of the $V_R/V_W$-generator and/or a portion of the A/D-translator. For example, it can be selected from a group of peripheral-circuit components including band-gap reference generator, $V_R$ generator, charge-pump circuit, boost converter, low-dropout regulator, buck converter, oscillator, error checking and correction circuit, page register, fault memory, trim-bit circuit and smart write controller. Apparently, the peripheral-circuit components 45 on the 3D-array die 30 include all peripheral-circuit components 48 of FIG. 4 except the peripheral-circuit component 43, which is located on the peripheral-circuit die 40. With fewer peripheral-circuit components, the array efficiency of the 3D-array die 30 of FIG. 6A can easily surpass 40%.

FIGS. 7A-7B disclose a second preferred partitioning scheme. The discrete 3D-M 50 comprises a 3D-array die 30 and another peripheral-circuit dice 40. In FIG. 7A, the 3D-array die 30 comprises only the 3D-M arrays (e.g. 22aa, 22ay) and their decoders, but not any peripheral-circuit component of FIG. 4. In FIG. 7B, the peripheral-circuit die 40 comprises all peripheral-circuit components, including $V_R/V_W$-generator 41 and A/D-translator 49. Without any peripheral-circuit component, the array efficiency of the 3D-array die 30 of FIG. 7A could reach ~60%. This leads to a substantially lower overall cost for the discrete 3D-M. As a simple estimate, suppose the wafer cost of the peripheral-circuit die 40 is about half of the 3D-array die 30 and the array efficiency increases from 30% to 60%, the overall cost of the discrete 3D-M is ~75% of the integrated 3D-M. That is a decrease of ~25% for a given storage capacity.

Figure 8A:
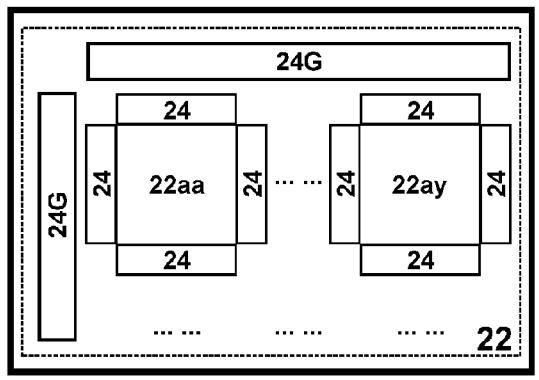
FIGS. 8A-8C disclose a third preferred partitioning scheme.
Figure 8B:
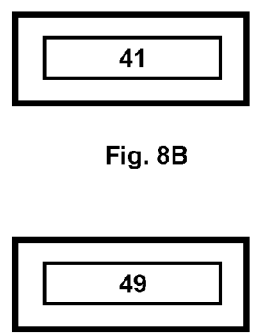
Figure 8C:
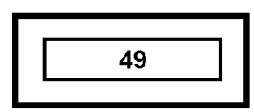

FIGS. 8A-8C disclose a third preferred partitioning scheme. The discrete 3D-M 50 comprises a 3D-array die 30 and two separate peripheral-circuit dice 40, 40*. Similar to FIG. 7A, the 3D-array die 30 of FIG. 8A comprises 3D-M arrays (e.g. 22aa, 22ay) and their decoders, but not any peripheral-circuit component of FIG. 4. Accordingly, the array efficiency of the 3D-array die 30 could reach ~60%. Different from FIG. 8B, the peripheral-circuit components are located on two separate dice 40, 40*: the peripheral-circuit die 40 comprises the $V_R/V_W$-generator 41 (FIG. 8B), while the peripheral-circuit die 40* comprises the A/D-translator 49 (FIG. 8C). As is well known to those skilled in the art, the $V_R/V_W$-generator is an analog-intensive circuit, while the A/D-translator is a digital-intensive circuit. Because they are located on separate dies, these circuits can be optimized independently: the $V_R/V_W$-generator die is optimized for analog performance, while the A/D-translator die is optimized for digital performance.

Figure 9A:
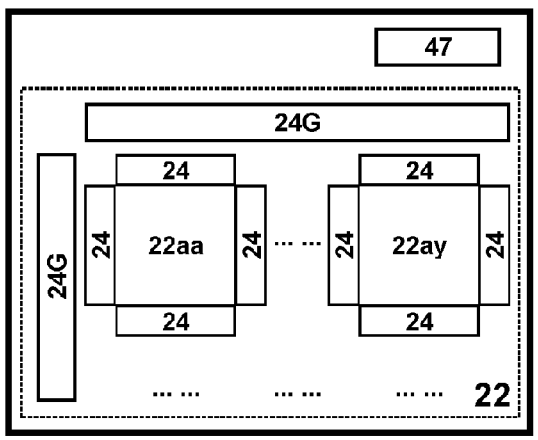
FIGS. 9A-9B disclose a fourth preferred partitioning scheme.
Figure 9B:
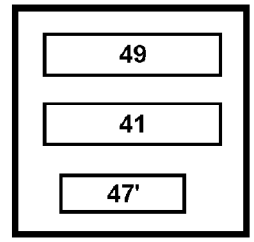

FIGS. 9A-9B disclose a fourth partitioning scheme. It is similar to those in FIGS. 7A-7B except that the 3D-array die 30 (FIG. 9A) further comprises a first serializer-deserializer (SerDes) 47. It converts parallel digital signals (e.g. address/data/command/status) inside the 3D-array die 30 to serial digital signals outside the 3D-array die 30 and vice versa. The peripheral-circuit die 40 (FIG. 9B) comprise a second serializer-deserializer (SerDes) 47'. It converts parallel digital signals (e.g. address/data/command/status) inside the peripheral-circuit die 40 to serial digital signals outside the peripheral-circuit die 40 and vice versa. By serializing digital signals, the number of bond wires (or, solder bumps) can be reduced between the 3D-array die 30 and the peripheral-circuit die 40. This helps to lower the bonding cost.

Figure 10A:
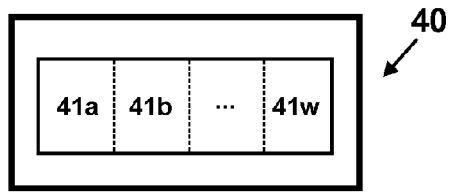
FIGS. 10A-10B are block diagrams of two preferred peripheral-circuit dice supporting multiple 3D-array dice.
Figure 10B:
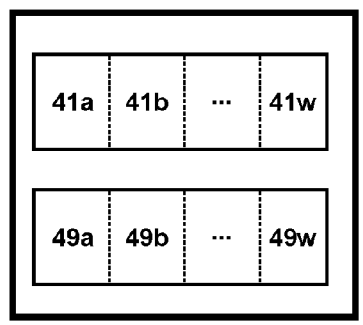

Referring now to FIGS. 10A-10B, two preferred peripheral-circuit dice 40 supporting multiple 3D-array dice are illustrated. The peripheral-circuit die 40 of FIG. 10A comprises a plurality of $V_R/V_W$-generators 41a, 41b . . . 41w. Each $V_R/V_W$-generator (e.g. 41a) provides read/write voltages to an associated 3D-array die (e.g. 30a of FIG. 2C). Similarly, the preferred peripheral-circuit die 40 of FIG. 10B further comprises a plurality of A/D-translators 49a, 49b . . . 49w. Each A/D-translator (e.g. 49a) translates address/data for an associated 3D-array die (e.g. 30a of FIG. 2C).

Figure 11A:
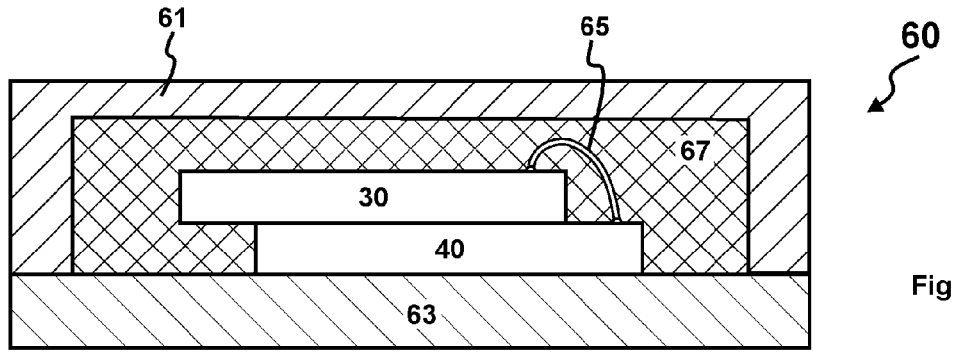
FIGS. 11A-11B are cross-sectional views of two preferred discrete 3D-M packages.
Figure 11B:
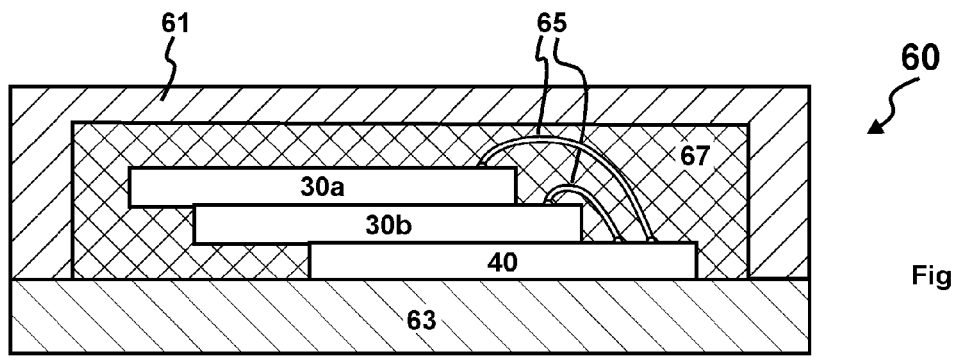
Figure 11C:
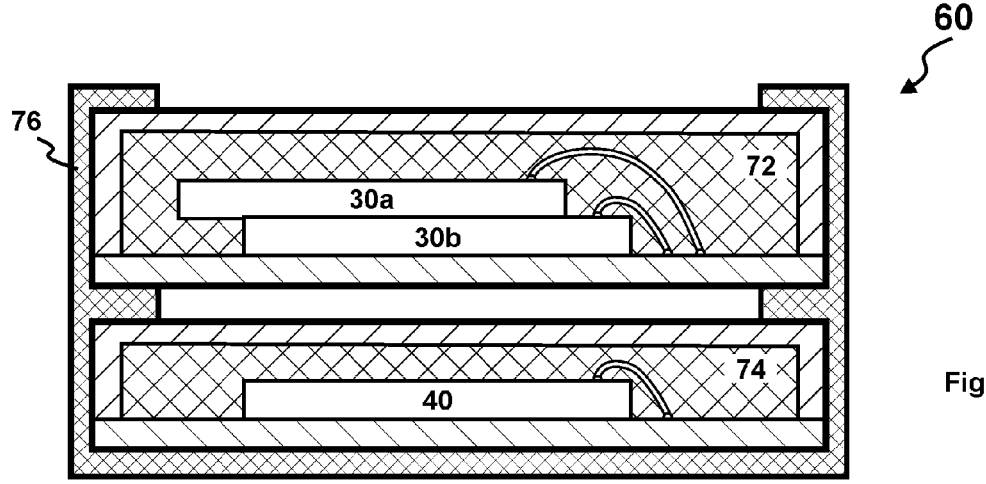
FIG. 11C is a cross-sectional view of a preferred discrete 3D-M module.

Referring now to FIG. 11A-11C, several preferred discrete 3D-M packages (or, module) 60 are disclosed. The 3D-M packages in FIGS. 11A-11B are multi-chip package (MCP), while the 3D-M module in FIG. 11C is a multi-chip module (MCM). These MCP and MCM can be used as a memory card and/or a solid-state drive.

The preferred discrete 3D-M package 60 of FIG. 11A comprises two separate dice: a 3D-array die 30 and a peripheral-circuit die 40. These dice 30, 40 are vertically stacked on a package substrate 63 and located inside a package housing 61. Bond wires 65 provide electrical connection between the dice 30 and 40. Here, bond wire 65 provides a coupling means between the 3D-array die 30 and the peripheral-circuit die 40. Other exemplary coupling means include solder bump. To ensure data security, the dice 30, 40 are preferably encapsulated into a molding compound 67. In this preferred embodiment, the 3D-array die 30 is vertically stacked above the peripheral-circuit die 40. Alternatively, the peripheral-circuit die 40 can be vertically stacked above the 3D-array die 30; or, the 3D-array die 30 can be stacked face-to-face towards the peripheral-circuit die 40; or, the 3D-array die 30 can be mounted side-by-side with the peripheral-circuit die 40.

The preferred discrete 3D-M package 60 of FIG. 11B comprises two 3D-array dice 30a, 30b and a peripheral-circuit die 40. These dice 30a, 30b, 40 are three separate dice. They are located inside a package housing 61. The 3D-array die 30a is vertically stacked on the 3D-array die 30b, and the 3D-array die 30b is vertically stacked on the peripheral-circuit die 40. Bond wires 65 provide electrical connections between the dice 30A, 30B, and 40.

The preferred discrete 3D-M module 60 of FIG. 11C comprises a module frame 76, which houses two discrete packages, i.e. a 3D-array package 72 and a peripheral-circuit package 74. The 3D-array package 72 comprises two 3D-array dice 30a, 30b, while the peripheral-circuit package 74 comprises a peripheral-circuit die 40. The module frame 76 provides electrical connections between the 3D-array package 72 and the peripheral-circuit package 74 (not drawn in this figure).

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A discrete three-dimensional memory (3DM), comprising:
   a 3D-array die comprising a plurality of 3D-M arrays, each of said 3D-M arrays including a plurality of vertically stacked memory levels;
   a peripheral-circuit die comprising at least a peripheral-circuit component for said 3D-M array;
   means for coupling said 3D-array die and said peripheral-circuit die;
   wherein said peripheral-circuit component is absent from said 3D-array die; said 3D-array die comprises more back-end-of-line (BEOL) layers than said peripheral-circuit die; and, said 3D-array die and said peripheral-circuit die are separate dice.

2. The memory according to claim 1, wherein said 3D-M comprises a three-dimensional read-only memory (3D-ROM) or a three-dimensional random-access memory (3D-RAM).

3. The memory according to claim 1, wherein said 3D-M comprises at least one of 3D-memristor, 3D-RRAM or 3D-ReRAM (resistive random-access memory), 3D-PCM (phase-change memory), 3D-PMC (programmable metallization-cell memory), and 3D-CBRAM (conductive-bridging random-access memory).

4. The memory according to claim 1, wherein said peripheral-circuit component is selected from a group of peripheral-circuit components consisting of read-voltage generator, write-voltage generator, address translator and data translator.

5. The memory according to claim 1, wherein said peripheral-circuit component is selected from a group of peripheral-circuit components consisting of band-gap reference generator, VR generator, charge-pump circuit, boost converter, low-dropout regulator, buck converter, oscillator, error checking and correction circuit, page register, fault memory, trim-bit circuit and smart write controller.

6. The memory according to claim 1, wherein said peripheral-circuit die further comprises at least a serializer-deserializer circuit.

7. The memory according to claim 1, wherein said 3D-array die and said peripheral-circuit die are located in a memory package, a memory module, a memory card or a solid-state drive.

8. The memory according to claim 1, further comprising another 3D-array die including at least another 3D-M array, wherein said peripheral-circuit die comprises at least another peripheral-circuit component for said another 3D-M array.

9. A discrete three-dimensional memory (3D-M), comprising:
   a 3D-array die comprising a plurality of 3D-M arrays, each of said 3D-M arrays including a plurality of vertically stacked memory levels;
   a peripheral-circuit die comprising at least a peripheral-circuit component for said 3D-M array;
   means for coupling said 3D-array die and said peripheral-circuit die;
   wherein said peripheral-circuit component is absent from said 3D-array die; said peripheral-circuit die comprises at least one different interconnect material than said 3D-array die; and, said 3D-array die and said peripheral-circuit die are separate dice.

10. The memory according to claim 9, wherein the interconnect materials of said 3D-array die are stable at a higher processing temperature than the interconnect materials of said peripheral-circuit die.

11. The memory according to claim 9, wherein at least an interconnect material of said peripheral-circuit die has a higher electrical conductivity than at least another interconnect material of said 3D-array die.

12. The memory according to claim 9, wherein said 3D-M comprises a three-dimensional read-only memory (3D-ROM) or a three-dimensional random-access memory (3D-RAM).

13. The memory according to claim 9, wherein said peripheral-circuit component is selected from a group of peripheral-circuit components consisting of read-voltage generator, write-voltage generator, address translator and data translator.

14. The memory according to claim 9, wherein said 3D-array die and said peripheral-circuit die are located in a memory package, a memory module, a memory card or a solid-state drive.

15. The memory according to claim 9, further comprising another 3D-array die including at least another 3D-M array, wherein said peripheral-circuit die comprises at least another peripheral-circuit component for said another 3D-M array.

16. A discrete three-dimensional memory (3D-M), comprising:
   a 3D-array die comprising a plurality of 3D-M arrays, each of said 3D-M arrays including a plurality of vertically stacked memory levels;
   a peripheral-circuit die comprising at least a peripheral-circuit component for said 3D-M array;
   means for coupling said 3D-array die and said peripheral-circuit die;
   wherein said peripheral-circuit component is absent from said 3D-array die; said peripheral-circuit die comprises more interconnect layers than said 3D-array die; and, said 3D-array die and said peripheral-circuit die are separate dice.

17. The memory according to claim 16, wherein said 3D-M comprises a three-dimensional read-only memory (3D-ROM) or a three-dimensional random-access memory (3D-RAM).

18. The memory according to claim 16, wherein said peripheral-circuit component is selected from a group of peripheral-circuit components consisting of read-voltage generator, write-voltage generator, address translator and data translator.

19. The memory according to claim 16, wherein said 3D-array die and said peripheral-circuit die are located in a memory package, a memory module, a memory card or a solid-state drive.

20. The memory according to claim 16, further comprising another 3D-array die including at least another 3D-M array, wherein said peripheral-circuit die comprises at least another peripheral-circuit component for said another 3D-M array.

* * * * *